United States Patent

Gomez et al.

[11] Patent Number: 5,424,682
[45] Date of Patent: Jun. 13, 1995

[54] VARIABLE GAIN AMPLIFIER CIRCUIT

[75] Inventors: Michael L. Gomez, Tempe; Nicholas H. Weiner, Chandler; William E. Main, Mesa, all of Ariz.

[73] Assignee: Motorola, Inc., Schaumburg, Ill.

[21] Appl. No.: 283,417

[22] Filed: Aug. 1, 1994

[51] Int. Cl.$^6$ ............................................. H03G 3/30
[52] U.S. Cl. .................................... 330/254; 330/257; 330/260; 330/278
[58] Field of Search ................ 330/254, 257, 260, 278, 330/311

[56] References Cited

U.S. PATENT DOCUMENTS 4,516,081  5/1985  Katakura ..................... 330/257 X
4,878,031 10/1989  Main ............................. 330/254

FOREIGN PATENT DOCUMENTS 25977  4/1981  European Pat. Off. ............ 330/254

Primary Examiner—James B. Mullins
Attorney, Agent, or Firm—Robert D. Atkins

[57] ABSTRACT

A variable gain control circuit (10) provides an output signal having a gain dependent on first (34) and second (52) reference current sources. An amplifier circuit (14, 20) generates first and second dynamic control voltages that control current flow through an input stage (30) referenced to the first reference current source. The dynamic control voltages produce similar currents in an output stage (32) referenced to the second reference current source. The dynamic control voltages to the input and output stage allow the variable gain amplifier circuit to operate with low power supply potentials which is especially useful in battery applications.

9 Claims, 4 Drawing Sheets 5,424,682

VARIABLE GAIN AMPLIFIER CIRCUIT

BACKGROUND OF THE INVENTION

The present invention relates in general to amplifier circuits and, more particularly, to a variable gain amplifier circuit.

Variable gain amplifier circuits are used in a myriad of applications, including receivers, transmitters and high fidelity electronics, anywhere it is necessary to adjust the amplitude of a signal. Specific circuits include attenuators, volume controls, tone controls, audio mixers, and companders.

A typical gain amplifier circuit is disclosed in FIG. 1 of U.S. Pat. No. 4,878,031 and includes an input stage and an output stage connected through a common node to the output of an op amp which in turn controls the current in each of the stages. The op amp senses a particular voltage, set by the magnitude of input current, and adjusts its output voltage to compel the input stage to sink the input current. The same op amp output voltage is applied to the output stage and controls the magnitude of the output current. Thus, a particular input current results in an particular output current proportional to the ratio of the current sources within the respective input and output stages. The input and output terminals receive current sources within the respective stages in such manner that the magnitude of the input and output currents is limited to that of the current source. Equivalently, these current sources must be sufficiently large as to handle the specifications of the input and output signals and, therefore are generally unacceptable in battery applications where power consumption is an issue. Also, in high fidelity and high power applications the excessive current in the variable gain amplifier circuit generates noise through common impedance to other components degrading the performance.

U.S. Pat. No. 4,878,031 further discloses another variable gain amplifier circuit in FIG. 2 that includes an input stage that is responsive to an applied input signal for providing an output signal at an output stage. The input stage and output stage are independently biased by respective bias sources and each include circuitry responsive to a dynamic control voltage, the latter of which is generated in response to the input signal, to permit the absolute magnitudes of the input signal and output signal to exceed the respective bias sources. The ratio of the output and input signals is proportional to the ratio of the bias sources. The circuit arrangement of the U.S. Pat. No. 4,878,031 in FIG. 2 requires an operating potential of say 2.3 volts for proper biasing and headroom. For battery applications it is desirable to further reduce the required operating potential.

Hence, a need exists for a variable gain amplifier circuit requiring low operating potential.

DETAILED DESCRIPTION OF THE PREFERRED EMBODIMENT

Figure 1:
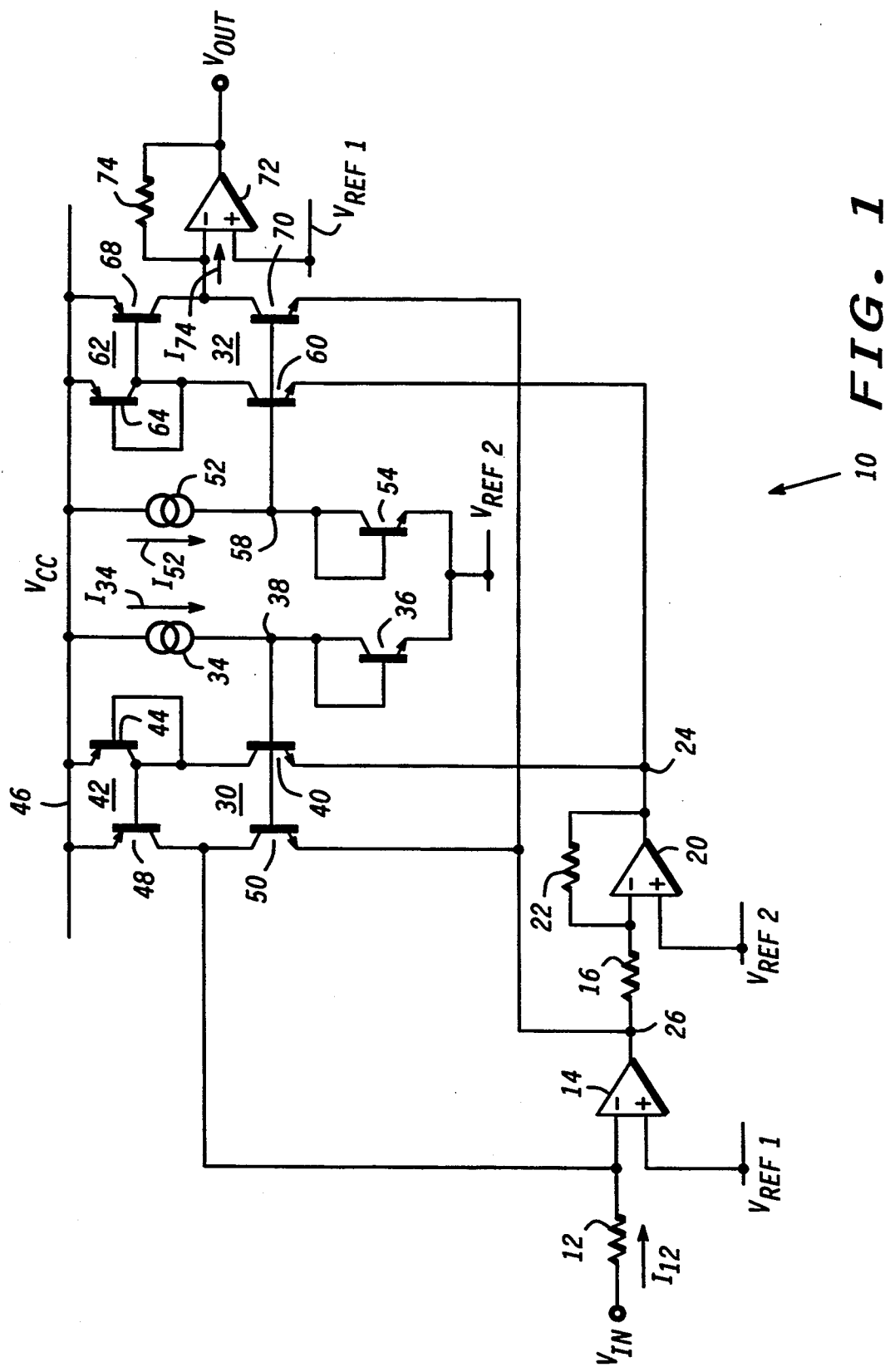
FIG. 1 is a schematic diagram illustrating a variable gain amplifier circuit.

With reference to FIG. 1, a variable gain amplifier circuit 10 is shown suitable for manufacturing as an integrated circuit using conventional integrated circuit processes. An input signal $V_{IN}$ is applied to resistor 12 such that a current $I_{12}$ flows to the inverting input of amplifier 14. The non-inverting input of amplifier 14 receives a reference potential $V_{REF1}$ operating at one-half $V_{CC}$, or about 0.9 volts. The output of amplifier 14 is coupled through resistor 16 to the inverting input of amplifier 20. The non-inverting input of amplifier 20 receives a reference potential $V_{REF2}$ operating at 200 millivolts. Resistor 22 is coupled between the output of amplifier 20 at node 24 and its inverting input. Resistors 12, 16 and 22 are each selected at 20K ohms. Amplifier 14 generates a first dynamic control voltage at node 26, while amplifier 20 generates a second dynamic control voltage at node 24.

Variable gain amplifier circuit 10 includes input stage 30 and output stage 32 and respective voltage reference circuits. The voltage reference circuit coupled to input stage 30 includes a bias current source 34 and diode-configured transistor 36. The emitter of transistor 36 receives the reference voltage $V_{REF2}$. A reference voltage is developed at node 38 as determined by current $I_{34}$ from current source 34. Input stage 30 includes transistor 40 having its collector coupled to the input of current mirror 42, and its emitter coupled to node 24. Current mirror 42 comprises transistor 44 having an emitter coupled to power supply conductor 46 operating at a positive potential $V_{CC}$ such as 1.8 volts. The base and collector of transistor 44 are coupled to the collector of transistor 40 and to the base of transistor 48. The emitter of transistor 48 is coupled to power supply conductor 46, while its collector is coupled to the collector of transistor 50 and to the inverting input of amplifier 14. The base of transistor 50 is coupled to node 38, while its emitter is coupled to node 26. Current mirror 42 enables the currents in transistors 40, 44 and 48 to be equal.

The voltage reference circuit coupled to output stage 32 comprises a bias current source 52 and diode-configured transistor 54. The emitter of transistor 54 receives the reference voltage $V_{REF2}$. A reference voltage is developed at node 58 as determined by current $I_{52}$ from current source 52. In an compander application for example, current source 34 and/or current source 52 may be controlled as a function of input or output signal amplitude of variable gain amplifier circuit 10. Output stage 32 includes transistor 60 having its collector coupled to the input of current mirror 62, and its emitter coupled to node 24. Current mirror 62 comprises transistor 64 having an emitter coupled to power supply conductor 46. The base and collector of transistor 64 are coupled to the collector of transistor 60 and to the base of transistor 68. The emitter of transistor 68 is coupled to power supply conductor 46, while its collector is coupled to the collector of transistor 70 and to the inverting input of amplifier 72. Current mirror 62 enables the currents in transistors 60, 64 and 68 to be equal. The base of transistor 70 is coupled to node 58, while its emitter is coupled to node 26. The non-inverting input of amplifier 72 receives the reference voltage $V_{REF1}$. Resistor 74 is coupled between the output of amplifier 72 and its inverting input. Resistor 74 is selected at 20K ohms. The output of amplifier 72 provides the output signal $V_{OUT}$ of variable gain amplifier circuit 10.

The operation of variable gain amplifier circuit 10 is first considered with a zero input signal $V_{IN}$. Amplifier 14 develops a voltage at node 26 that positions the base-emitter junction potential ($V_{be}$) of transistor 50 such that its collector sinks the output current of current mirror 42. Since no current flows through resistor 12, the $V_{be}$ of transistor 40 equals the $V_{be}$ of transistor 50 and the currents in transistors 40 and 50 match. The voltage at node 24 is positioned equal to the voltage at node 26. A similar relationship holds true for output stage 32. The $V_{be}$ of transistors 60 and 70 and their currents are equal such that transistor 70 sinks the output current from current mirror 62. Consequently, the output signal $V_{OUT}$ is zero. The zero input signal and zero output signal means that the voltage has zero offset from $V_{REF1}$.

Now assume that the input signal $V_{IN}$ increases. Amplifier 14 is configured in an inverting mode. Hence, the dynamic control voltage at node 26 falls as the input signal $V_{IN}$ increases and the $V_{be}$ of transistor 50 increases. Amplifier 20 also inverts the dynamic control voltage from node 26 so that the dynamic control voltage at node 24 increases with the input signal $V_{IN}$. The $V_{be}$ of transistor 40 decreases and less current flows through current mirror 42. The decreasing current from transistor 48 and the increasing current through transistor 50 adjust to sink the current flowing through the connection from resistor 12 to the collector of transistor 50. The lower voltage at node 26 also increases the $V_{be}$ of transistor 70, while the higher voltage at node 24 decreases the $V_{be}$ of transistor 60. Less current flows through transistor 60 and current mirror 62. Because of the virtual ground at the inverting input of amplifier 72, the increasing current flow through transistor 70 and the decreasing current flow through transistor 68 causes the output voltage $V_{OUT}$ to increase.

If the input signal $V_{IN}$ decreases, the dynamic control voltage at node 26 increases and the $V_{be}$ of transistor 50 decreases. The dynamic control voltage at node 24 decreases with the input signal $V_{IN}$. The $V_{be}$ of transistor 40 increases and more current flows through current mirror 42. The increasing current from transistor 48 and the decreasing current through transistor 50 adjust to source the current flowing through the connection from the collector of transistor 50 to resistor 12. The higher voltage at node 26 also decreases the $V_{be}$ of transistor 70, while the lower voltage at node 24 increases the $V_{be}$ of transistor 60. More current flows through transistor 60 and current mirror 62. Because of the virtual ground at the inverting input of amplifier 72, the decreasing current flow through transistor 70 and the increasing current flow through transistor 68 causes the output voltage $V_{OUT}$ to decrease. Thus, a particular input voltage $V_{IN}$ (or input current $I_{12}$) results in an particular output voltage $V_{OUT}$ (or output current) that is proportional to the ratio of the current sources within the respective input and output stages. The output signal $V_{OUT}$ is given as:

$$V_{OUT} = \frac{R_{74}}{R_{12}} \times \frac{I_{52}}{I_{34}} \times V_{IN} \quad (1)$$

As one feature of the present invention, transistors 40 and 50 and transistors 60 and 70 are referenced to nodes 24 and 26, respectively. The transistor arrangement allows nodes 38 and 58 to be separated from reference voltage $V_{REF2}$ by a single diode, e.g. transistors 36 and 54 and the power supply potential of the variable gain amplifier circuit to operate at or near 1.8 volts. The low operating potential is especially useful in battery applications.

Figure 2:
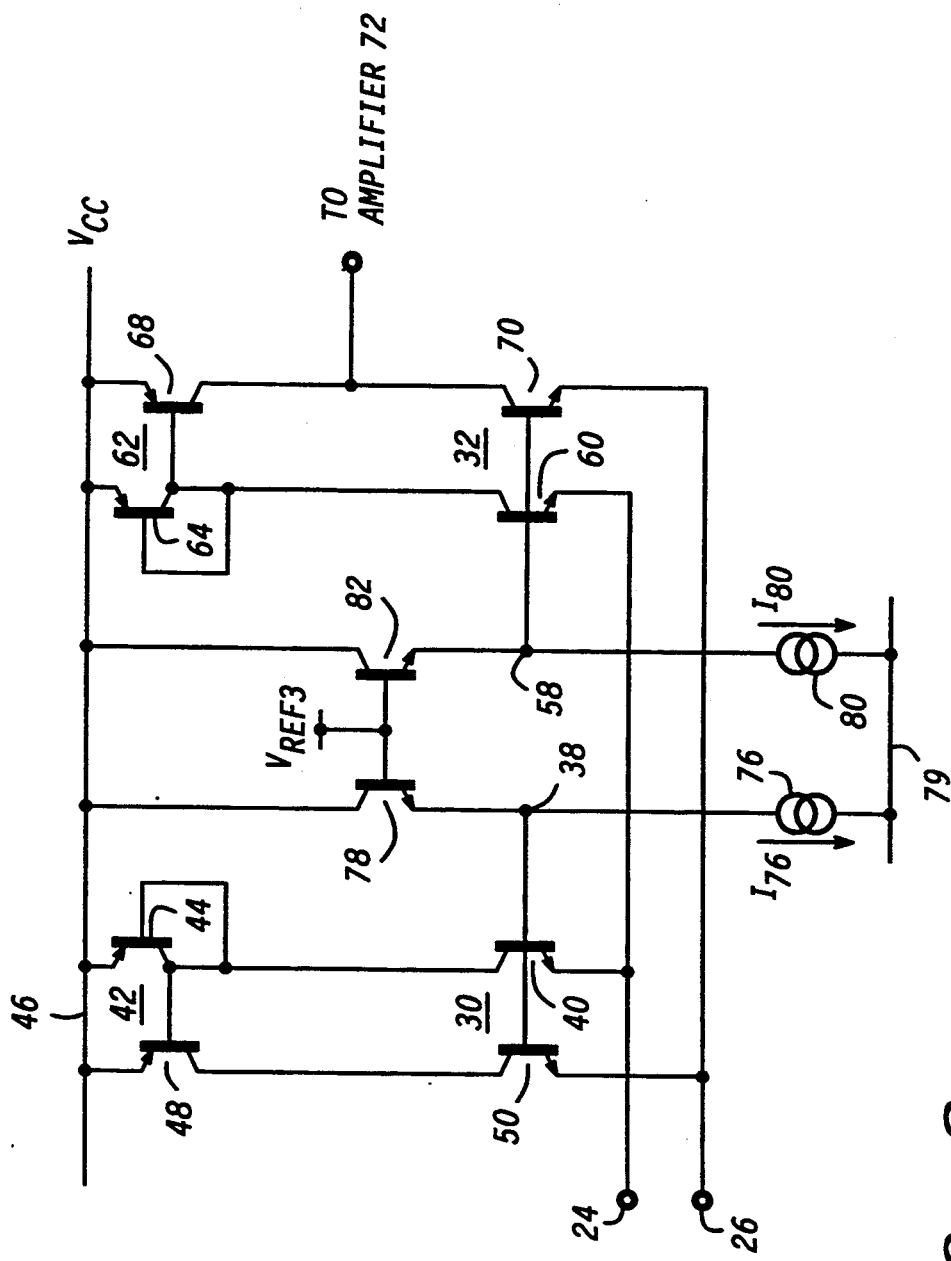
FIG. 2 is a schematic diagram illustrating an alternate embodiment of the voltage reference circuit of FIG. 1.

Turning to FIG. 2, an alternate embodiment of the voltage reference circuits for input stage 30 and output stage 32 is shown. Components having a similar function are assigned the same reference number used in FIG. 1. The voltage reference circuit for input stage 30 is modified such that current source 76 sinks current $I_{76}$ from transistor 78 to power supply conductor 79 operating at ground potential. The collector of transistor 78 is coupled to power supply conductor 46 while its base receives reference voltage $V_{REF3}$ operating at 1.6 volts. The emitter of transistor 78 is coupled to node 38. A reference voltage is developed at node 38 as determined by current $I_{76}$ from current source 76.

In a similar manner, the voltage reference circuit for output stage 32 is modified such that current source 80 sinks current $I_{80}$ from transistor 82 to power supply conductor 79. The collector of transistor 82 is coupled to power supply conductor 46 while its base receives reference voltage $V_{REF3}$. The emitter of transistor 82 is coupled to node 58. A reference voltage is developed at node 58 as determined by current $I_{80}$ from current source 80. In an compander application for example, current source 76 and/or current source 80 may be controlled as a function of input or output signal amplitude of variable gain amplifier circuit 10. Again, a particular input voltage $V_{IN}$ (or input current $I_{12}$) results in an particular output voltage $V_{OUT}$ (or output current) that is proportional to the ratio of the current sources within the respective input and output stages. The operation of input stage 30 and output stage 32 follows the description for FIG. 1 with the exception that the reference voltage circuit arrangement results in an output voltage $V_{OUT}$ given as:

$$V_{OUT} = \frac{R_{74}}{R_{12}} \times \frac{I_{76}}{I_{80}} \times V_{IN} \quad (2)$$

Figure 3:
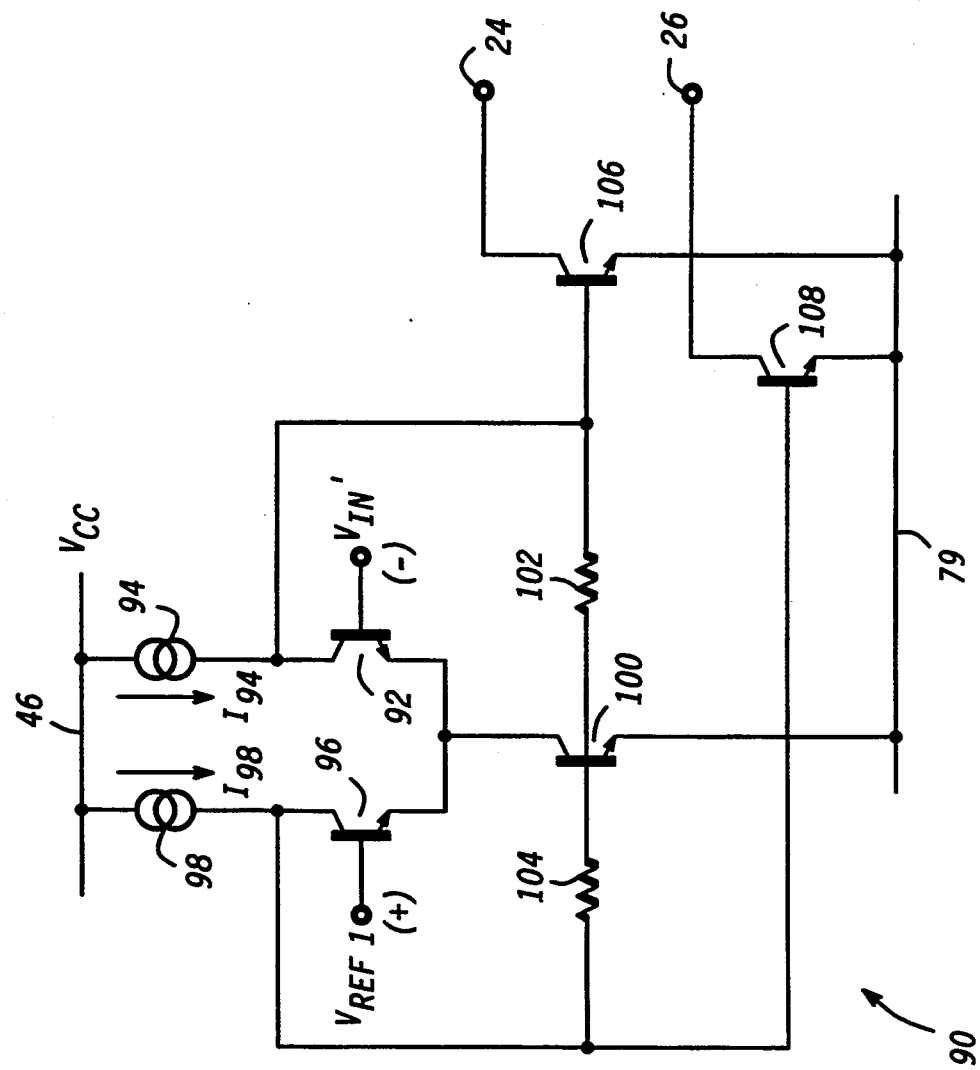
FIG. 3 is a schematic diagram illustrating an alternate embodiment of the amplifier circuit of FIG. 1.

In FIG. 3, an alternate embodiment of the input amplifier stage is shown to replace amplifiers 14 and 20 in FIG. 1. The input signal $V_{IN}'$ is applied to the inverting input of amplifier 90 at the base of transistor 92. The collector of transistor 92 receives current $I_{94}$ sourced by current source 94 from power supply conductor 46. The noninverting input of amplifier 90 receives the reference voltage $V_{REF1}$ at the base of transistor 96. The collector of transistor 96 receives current $I_{98}$ sourced by current source 98 from power supply conductor 46. The common emitters of transistors 92 and 96 are coupled to the collector of transistor 100. The emitter of transistor 100 is coupled to power supply conductor 79. Resistor 102 is coupled between the collector of transistor 92 and the base of transistor 100. Likewise, resistor 104 is coupled between the collector of transistor 96 and the base of transistor 100. Resistors 102 and 104 are each selected at 10K ohms. Transistor 106 has a base coupled to the collector of transistor 92 and an emitter coupled to power supply conductor 79. Transistor 108 has a base coupled to the collector of transistor 96 and an emitter coupled to power supply conductor 79. The collector of transistor 106 is coupled to node 24, while the collector of transistor 108 is coupled to node 26.

In a balanced condition, the bases of transistors 92 and 96 receive the same potential and conduct equal currents. The voltage at the collectors of transistors 92 and 96 are equal and the voltage at nodes 24 and 26 are equal. Resistors 102 and 104 perform a differential sensing and maintain a constant voltage at the base of transistor 100. Transistor 100 thus conducts a constant current. If the input signal $V_{IN}'$ increases above the reference voltage $V_{REF1}$, then transistor 92 conducts more current and its collector voltage falls. Transistor 106 receives less base drive which allows node 24 to increase in signal level. At the same time, transistor 96 conducts less current and its collector voltage rises. Transistor 108 receives more base drive whereby node 26 decreases in signal level. Alternately, if the input signal $V_{IN}'$ decreases below the reference voltage $V_{REF1}$, then transistor 92 conducts less current and its collector voltage rises. Transistor 106 receives more base drive which causes node 24 to decrease in signal level. Transistor 96 conducts more current and its collector voltage falls. Transistor 108 receives less base drive whereby node 26 increases in signal level. The operation of amplifier 90 thus matches that described for amplifiers 14 and 20.

Figure 4:
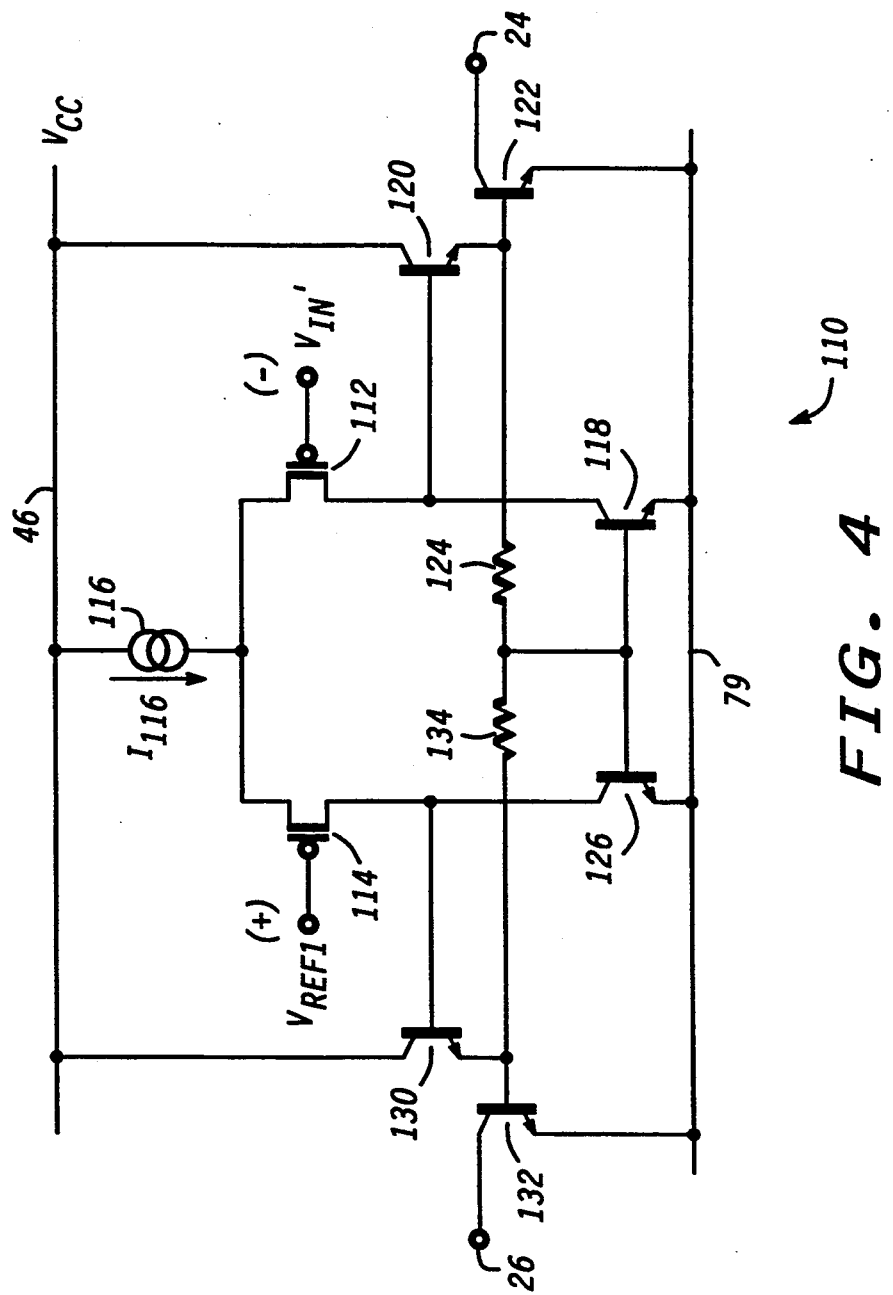
FIG. 4 is a schematic diagram illustrating an alternate embodiment of the amplifier circuit of FIG. 1.

In FIG. 4, another embodiment of the input amplifier stage is shown to replace amplifiers 14 and 20 in FIG. 1. The input signal $V_{IN}'$ is applied to the inverting input of amplifier 110 at the gate of transistor 112. The noninverting input of amplifier 110 receives the reference voltage $V_{REF1}$ at the gate of transistor 114. The sources of transistors 112 and 114 receives current $I_{116}$ sourced by current source 116 from power supply conductor 46. The drain of transistor 112 is coupled to the collector of transistor 118 and to the base of transistor 120. The collector of transistor 120 is coupled to power supply conductor 46, while its emitter is coupled to the base of transistor 122. The emitters of transistors 118 and 122 are coupled to power supply conductor 79. The collector of transistor 122 is coupled to node 24 in FIG. 1. Resistor 124 is coupled between the emitter of transistor 120 and the common bases of transistors 118 and 126. The drain of transistor 114 is coupled to the collector of transistor 126 and to the base of transistor 130. The collector of transistor 130 is coupled to power supply conductor 46, while its emitter is coupled to the base of transistor 132. The emitters of transistors 126 and 132 are coupled to power supply conductor 79. The collector of transistor 132 is coupled to node 26 in FIG. 1. Resistor 134 is coupled between the emitter of transistor 130 and the common bases of transistors 118 and 126. Resistors 124 and 134 are each selected at 10K ohms.

In a balanced condition, the gates of transistors 112 and 114 receive the same potential and conduct equal currents through transistors 118 and 126, respectively. The voltages at the collectors of transistors 118 and 126 are equal and the voltages at nodes 24 and 26 are equal. Resistors 124 and 134 perform a differential sensing and maintain a constant voltage at the bases of transistors 118 and 126.

If the input signal $V_{IN}'$ increases above the reference voltage $V_{REF1}$, then transistor 114 conducts more current and the collector voltage of transistor 126 rises. Transistors 130 and 132 each receive more base drive whereby node 26 decreases in signal level. At the same time, transistor 112 conducts less current and the collector voltage of transistor 118 falls. Transistors 120 and 122 each receive less base drive which allows node 24 to increase in signal level. Alternately, if the input signal $V_{IN}'$ decreases below the reference voltage $V_{REF1}$, then transistor 114 conducts less current and the collector voltage of transistor 126 falls. Transistors 130 and 132 each receive less base drive which allows node 26 to increase in signal level. At the same time, transistor 112 conducts more current and the collector voltage of transistor 118 rises. Transistors 120 and 122 each receive more base drive whereby node 24 decreases in signal level. The operation of amplifier 110 thus matches that described for amplifiers 14 and 20.

By now it should be appreciated that the present invention provides a variable gain amplifier circuit that provides an output signal having a gain dependent on first and second reference current sources. An amplifier circuit generates first and second dynamic control voltages that control current flow through an input stage referenced to the first reference current source. The dynamic control voltages produce similar currents in an output stage referenced to the second reference current source. The dynamic control voltages to the input and output stage allow the variable gain amplifier circuit to operate with low power supply potentials which is especially useful in battery applications.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit, comprising:
an amplifier circuit having an input coupled for receiving an input signal and having first and second outputs for providing first and second dynamic control voltages at first and second nodes respectively;
a first transistor having a base, a collector, and an emitter, said base being coupled for receiving a first reference voltage, said emitter being coupled to said first node;
a second transistor having a base, a collector, and an emitter, said base being coupled for receiving said first reference voltage, said emitter being coupled to said second node, said collector being coupled for receiving said input signal:
a first current mirror having an input coupled to said collector of said first transistor and having an output coupled to said collector of said second transistor;
a third transistor having a base, a collector, and an emitter, said base being coupled for receiving a second reference voltage, said emitter being coupled to said first node;
a fourth transistor having a base, a collector, and an emitter, said base being coupled for receiving said second reference voltage, said emitter being coupled to said second node, said collector providing an output signal of the circuit; and
a second current mirror having an input coupled to said collector of said third transistor and having an output coupled to said collector of said fourth transistor;
said amplifier circuit including,
(a) a first current source having an output for providing a first current,
(b) a fifth transistor having a base, a collector, and an emitter, said base being coupled for receiving said input signal, said collector being coupled to said output of said first current source, (c) a second current source having an output for providing second current, (d) a sixth transistor having a base, a collector, and an emitter, said base being coupled for receiving a third reference voltage, said collector being coupled to said output of said second current source, (e) a seventh transistor having a base, a collector, and an emitter, said collector being coupled to said emitters of said fifth and sixth transistors, said emitter being coupled to a first power supply conductor, (f) a first resistor coupled between said collector of said fifth transistor and said base of said seventh transistor, and (g) a second resistor coupled between said collector of said sixth transistor and said base of said seventh transistor.

2. The circuit of claim 1 wherein said amplifier circuit further includes:
an eighth transistor having a base, a collector, and an emitter, said base being coupled to said collector of said fifth transistor, said collector being coupled to said first node, said emitter being coupled to said first power supply conductor; and
a ninth transistor having a base, a collector, and an emitter, said base being coupled to said collector of said sixth transistor, said collector being coupled to said second node, said emitter being coupled to said first power supply conductor.

3. The circuit of claim 1 further including:
a third current source having an output for providing a third current;
an eighth transistor having a base, a collector, and an emitter, said collector being coupled to a second power supply conductor, said emitter being coupled to said output of said third current source for providing said first reference voltage, said base being coupled for receiving a fourth reference voltage;
a fourth current source having an output for providing a fourth current; and
a ninth transistor having a base, a collector, and an emitter, said collector being coupled to said second power supply conductor, said emitter being coupled to said output of said fourth current source for providing said second reference voltage, said base being coupled for receiving said fourth reference voltage.

4. The circuit of claim 1 further including:
a third current source having an output for providing a third current;
an eighth transistor having a base, a collector, and an emitter, said base and collector being coupled together to said output of said third current source for providing said first reference voltage, said emitter being coupled for receiving a fourth reference voltage;
a fourth current source having an output for providing a fourth current; and
a ninth transistor having a base, a collector, and an emitter, said base and collector being coupled together to said output of said fourth current source for providing said second reference voltage, said emitter being coupled for receiving said fourth reference voltage.

5. The circuit of claim 1 wherein said first current mirror includes:
an eighth transistor having a base, a collector, and an emitter, said base and collector being coupled to said collector of said first transistor, said emitter being coupled to a second power supply conductor; and
a ninth transistor having a base, a collector, and an emitter, said base being coupled to said base and collector of said eighth transistor, said emitter being coupled to said second power supply conductor, said collector being coupled to said collector of said second transistor.

6. The circuit of claim 5 wherein said second current mirror includes:
a tenth transistor having a base, a collector, and an emitter, said base and collector being coupled to said collector of said third transistor, said emitter being coupled to said second power supply conductor; and
an eleventh transistor having a base, a collector, and an emitter, said base being coupled to said base and collector of said tenth transistor, said emitter being coupled to said second power supply conductor, said collector being coupled to said collector of said fourth transistor.

7. A variable gain amplifier circuit, comprising:
an amplifier circuit having an input coupled for receiving an input signal and having first and second outputs for providing first and second dynamic control voltages at first and second nodes respectively;
a first transistor having a base, a collector, and an emitter, said base being coupled for receiving a first reference voltage, said emitter being coupled to said first node;
a second transistor having a base, a collector, and an emitter, said base being coupled for receiving said first reference voltage, said emitter being coupled to said second node, said collector being coupled for receiving said input signal;
a first current mirror having an input coupled to said collector of said first transistor and having an output coupled to said collector of said second transistor;
a third transistor having a base, a collector, and an emitter, said base being coupled for receiving a second reference voltage, said emitter being coupled to said first node;
a fourth transistor having a base, a collector, and an emitter, said base being coupled for receiving said second reference voltage, said emitter being coupled to said second node, said collector providing an output signal of the gain control circuit; and
a second current mirror having an input coupled to said collector of said third transistor and having an output coupled to said collector of said fourth transistor;
said amplifier circuit including,
(a) a first current source having an output for providing a first current;
(b) a fifth transistor having a gate, a drain, and a source, said gate being coupled for receiving said input signal, said source being coupled to said output of said first current source;
(c) a sixth transistor having a gate, a drain, and a source, said gate being coupled for receiving a third reference voltage, said source being coupled to said output of said first current source;

(d) a Seventh transistor having a base, a collector, and an emitter, said collector being coupled to said drain of said fifth transistor, said emitter being coupled to a first power supply conductor;

(e) an eighth transistor having a base, a collector, and an emitter, said collector being coupled to said drain of said sixth transistor, said emitter being coupled to said first power supply conductor;

(f) a ninth transistor having a base, a collector, and an emitter, said base being coupled to said collector of said seventh transistor, said collector being coupled to a second power supply conductor;

(g) a tenth transistor having a base, a collector, and an emitter, said base being coupled to said emitter of said ninth transistor, said collector being coupled to said first node, said emitter being coupled to said first power supply conductor;

(h) an eleventh transistor having a base, a collector, and an emitter, said base being coupled to said collector of said eighth transistor, said collector being coupled to said second power supply conductor;

(i) a twelfth transistor having a base, a collector, and an emitter, said base being coupled to said emitter of said eleventh transistor, said collector being coupled to said second node, said emitter being coupled to said first power supply conductor;

(j) a first resistor coupled between said emitter of said ninth transistor and said bases of said seventh and eighth transistors; and (h) a second resistor coupled between said emitter of said eleventh transistor and said bases of said seventh and eighth transistors.

8. The variable gain amplifier circuit of claim 7 further including:

a second current source having an output for providing a second current;

a thirteenth transistor having a base, a collector, and an emitter, said base and collector being coupled together to said output of said second current source for providing said first reference voltage, said emitter being coupled for receiving a fourth reference voltage;

a third current source having an output for providing a third current; and a fourteenth transistor having a base, a collector, and an emitter, said base and collector being coupled together to said output of said third current source for providing said second reference voltage, said emitter being coupled for receiving said fourth reference voltage.

9. The variable gain amplifier circuit of claim 7 further including:

a second current source having an output for providing a second current;

a thirteenth transistor having a base, a collector, and an emitter, said collector being coupled to said second power supply conductor, said emitter being coupled to said output of said second current source for providing said first reference voltage, said base being coupled for receiving a fourth reference voltage;

a third current source having an output for providing a third current; and a fourteenth transistor having a base, a collector, and an emitter, said collector being coupled to said second power supply conductor, said emitter being coupled to said output of said third current source for providing said second reference voltage, said base being coupled for receiving said fourth reference voltage.

* * * * *